United States Patent [19]

Yamakawa et al.

[11] Patent Number: 4,970,571
[45] Date of Patent: Nov. 13, 1990

[54] BUMP AND METHOD OF MANUFACTURING THE SAME

[75] Inventors: Koji Yamakawa, Tokyo; Nobuo Iwase, Kamakura; Michihiko Inaba, Yokohama, all of Japan

[73] Assignee: Kabushiki Kaisha Toshiba, Kawasaki, Japan

[21] Appl. No.: 248,101

[22] Filed: Sep. 23, 1988

[30] Foreign Application Priority Data

Sep. 24, 1987 [JP] Japan .................................. 62-239817
Mar. 15, 1988 [JP] Japan .................................. 63-61386

[51] Int. Cl.$^5$ ..................... H01L 23/48; H01L 29/46; H01L 29/54; H01L 29/62
[52] U.S. Cl. ............................................ 357/71; 357/65
[58] Field of Search ................................ 357/65, 71

[56] References Cited

U.S. PATENT DOCUMENTS 4,680,610  7/1987  Pammer ............................... 357/65
4,831,432  5/1989  Hori et al. ............................ 357/65

Primary Examiner—William L. Sikes
Assistant Examiner—Robert E. Wise
Attorney, Agent, or Firm—Oblon, Spivak, McClelland, Maier & Neustadt

[57] ABSTRACT

According to the present invention, there is provided a method for forming a bump and comprising the steps of dipping a semiconductor element with an Al electrode and a passivation film formed thereon in a palladium solution containing 5 to 2,000 ppm of at least one element selected from the group consisting of Zn, Pb, Sn, Cd, and Cr, selectively precipitating palladium on the electrode, and conducting electroless nickel-plating on the semiconductor element, including the electrode on which palladium is precipitated.

13 Claims, 6 Drawing Sheets

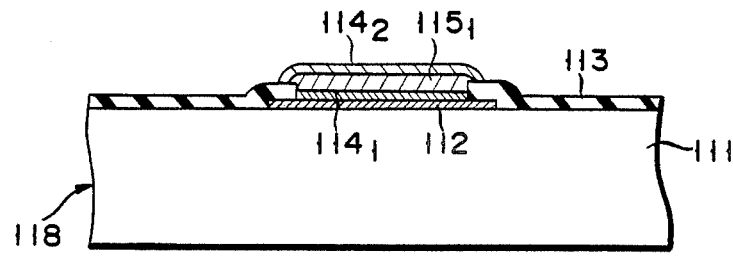
F I G. 3D
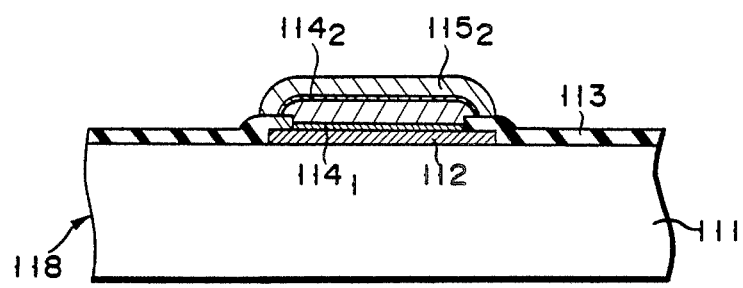
F I G. 3E
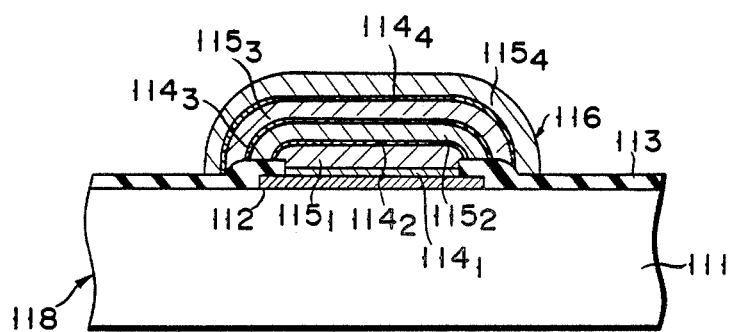
F I G. 3F

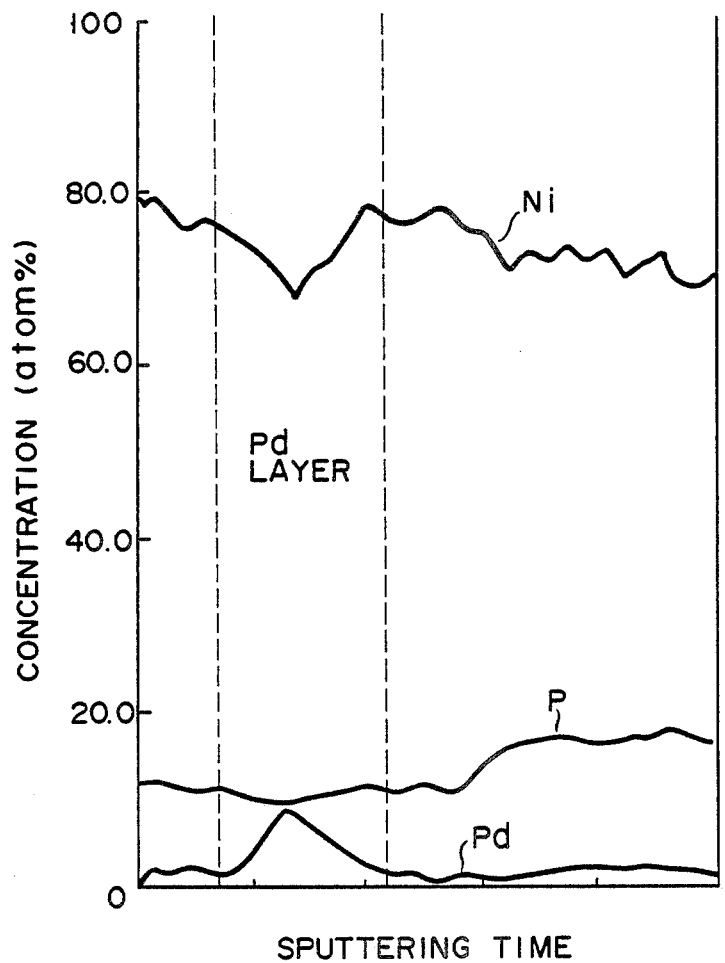
F I G. 4

BUMP AND METHOD OF MANUFACTURING THE SAME

BACKGROUND OF THE INVENTION

1. Field of the Invention

The present invention relates to a bump and a method of manufacturing the same and, more particularly, to a bump selectively formed on the surface of an electrode and capable of being well-connected to an external wiring layer, and a method for manufacturing the same.

2. Description of the Related Art

In recent years, with the advances made in the miniaturization of electronic devices, integration densities of IC's and LSI's have been greatly increased. In mounting of semiconductor elements onto a substrate, the distance (pitch) between electrode is reduced and the number of I/O terminals is increased. Incidentally in card type calculators and IC cards, a demand has arisen for developing low-profile products which require short pitches.

By the way, since wireless bonding such as a TAB and a flip chip can advantageously realize collective bonding of electrodes and high-precision alignment between electrodes, low-profile and automatic mounting of semiconductor elements with high reliability can be expected. Therefore, the wireless bonding becomes a mainstream of mounting techniques of LSI chips from now on. In performing wireless bonding, metal projections known simply as bumps are generally formed on aluminum electrodes of LSI chips. FIGS. 1A to 1D illustrate the steps involved in forming these bumps according to the conventional method.

First, as is shown in FIG. 1, passivation film 3, composed of $SiO_2$ or $Si_3N_4$, is formed on the entire surface of semiconductor wafer 1 on which is already formed Al electrode 2. Next, passivation film 3 is selectively etched to expose most of Al electrode 2. Thereafter, as is shown in FIG. 1B, underlying metal film 4 is formed on the entire surface of wafer 1, including passivation film 3, by deposition or by sputtering, and resist pattern 5 is formed thereon, by use of a photo engraving process (PEP), except for that portion of metal film 4 which corresponds to Al electrode 2. Next, as is shown in FIG. 1C, metal projection 6 is selectively formed, by electroplating, on a portion including part of exposed underlying metal film 4, with film 4 serving as a cathode in this process. After resist pattern 5 is removed, exposed underlying metal film 4 is removed using metal projection 6 as a mask to form the bump (FIG. 1D).

The above conventional bump forming method, has the following drawbacks, however. To begin with the conventional method entails a large number of processing steps, such as the formation of the underlying metal film, formation of the resist pattern by a PEP, removal of the resist pattern after electroplating, and etching of the underlying metal film, resulting in a high manufacturing cost. Furthermore, in these steps, many substances involved in etching, PEP etc. are likely to contaminate the LSI chips. In addition, since the above method for forming the bump is practiced on a wafer, bumps cannot be formed on LSI chips obtained by dicing a wafer. For this reason, if a wafer has LSI chips having defective semiconductor elements, the inefficiency to form bumps on the LSI chips including the defective elements cannot be avoided.

For these reasons, an attempt has been made to form bumps on only the diced LSI chips having no defective semiconductor elements by electroless palladium-activated nickel plating. In the conventional electroless plating, zinc substitution is applied as a pretreatment. However, since a substitution solution in the zinc substitution is a strong alkali, the LSI chips may be adversely affected, e.g., a silicon substrate and the Al electrode are corroded. In this case, since the palladium is precipitated on the allover surfaces of the chips including passivation film, and activates the surfaces, nickel films are precipitated on not only the electrodes but also the passivation films during the following electroless nickel plating process. As a result, an electrical short circuit may occur between the bumps through the nickel films precipitated on the passivation films. In particular, when bump intervals are reduced with high integration densities of the LSI chips, short-circuiting frequently occurs between these bumps, thereby causing the reduction in yield.

SUMMARY OF THE INVENTION

The present invention has been developed in order to solve the problems associated with the conventional method, and provides a bump-forming method which comprises the steps of dipping a semiconductor element with an Al electrode and a passivation film formed thereon in a palladium solution containing 5 to 2,000 ppm of at least one element selected from the group consisting of Zn, Pb, Sn, Cd, and Cr, selectively precipitating palladium on the electrode, and performing electroless nickel-plating on the semiconductor element, including the electrode on which palladium is precipitated.

According to the present invention, there is also provided a bump which comprises an Al electrode formed on a semiconductor element and a layer in which palladium layers formed on the electrode and bump material layers formed by electroless nickel plating are alternatively laminated two or more times.

BRIEF DESCRIPTION OF THE DRAWINGS

FIGS. 2A, 2B, 2C, and 2D and FIGS. 3A, 3B, 3C, 3D, and 3F are, respectively, sectional views showing steps involved in the manufacturing of bumps according to first and second embodiments of the present invention;

FIG. 4 is a graph for analyzing the Auger electron spectroscopy of the bumps of the present invention;

DETAILED DESCRIPTION OF THE PREFERRED EMBODIMENTS

Figure 1A:
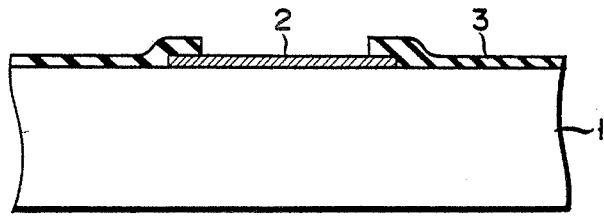
FIGS. 1A, 1B, 1C, and 1D are sectional views showing steps involved in the manufacturing of a conventional bump.
Figure 1B:
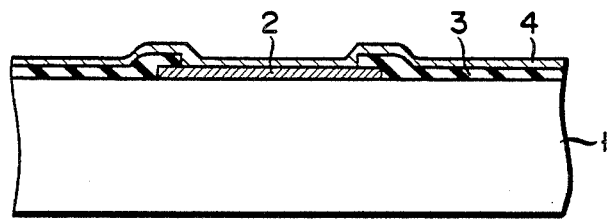
Figure 1C:
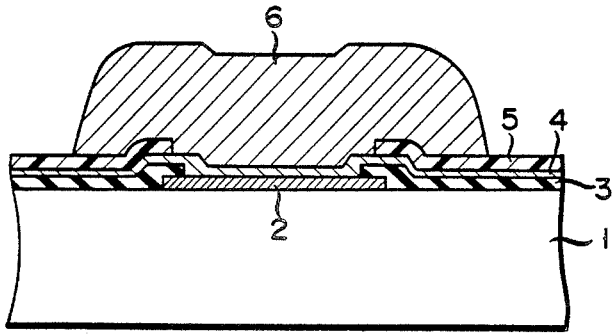
Figure 1D:
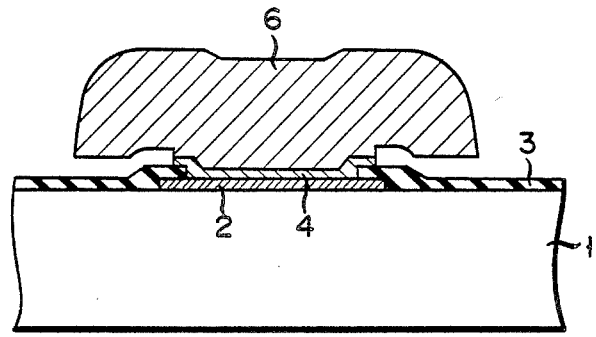

The structural elements of the present invention are explained in detail hereinafter.

Zn, Pb, Sn, Cd, or Cr contained in a palladium solution involved in the present invention is used to selectively precipitate palladium on only an aluminum electrode during activation of LSI chips by the palladium solution. When the content of these elements in a palladium solution is less than 5 ppm, the palladium cannot be selectively precipitated. On the other hand, if more than 2,000 ppm, the palladium will not be precipitated at all. The content preferably falls within the range of 50 to 300 ppm, and the precipitation of the palladium is desirably performed at 20° to 40° C.

As an example of a palladium solution, a palladium chloride solution or the like can be used to activate the surface of the aluminum electrode for the selective palladium precipitation. The surface of the electrode may be cleaned prior to the activation by the palladium solution, using an acid such as hydrochloric acid, sulfuric acid, nitric acid, or phosphoric acid, or an alkali.

After an electroless-plated nickel film is formed on an Al electrode, a step of annealing it at 100° to 500° C. can be added to remarkably improve adhesion of the plated nickel film against the aluminum electrode. The reason why the adhesion is improved by such annealing is not clear. However, it is considered that the precipitated nickel and the aluminum of the electrode material are diffused to each other by annealing, and a layer for improving adhesion is formed at the interface therebetween. Thus, by improving the adhesion of the plated nickel film with the aluminum electrode, peeling of the plated nickel film can be prevented when a different species of metal (e.g., copper) is plated or soldered on the plated nickel film serving as an underlying film. It should be noted that the annealing temperature is limited to the range stated above, for the following reasons.

If the annealing temperature is less than 100° C., the above-described adhesion effect cannot be obtained. On the other hand, if the annealing temperature is greater than 500° C., a diffusion layer formed on the LSI chips will be diffused again, or the aluminum will melt, thereby making a product defective.

The above annealing process is performed any time after the underlying nickel film is formed. When a thick nickel layer is formed, thereby becoming a bump, annealing process may be performed after the bump is formed. When a copper bump is formed on an electroless-plated nickel layer by electroless copper plating, annealing process may be performed after an underlying nickel film is formed or the copper bump is formed.

The above LSI chips are obtained by dicing the wafer after the normal steps in manufacturing the chips. The region except for the Al electrode is covered by a passivation film such as an $SiO_2$, $Si_3N_4$, or PSG (phosphorous silicate glass) film.

Nickel, or a nickel-containing material such as an Ni-P alloy is used as the material for the bump. When the thickness of the palladium layer is 50 Å or more, it is sufficiently effective. However, if the layer is too thick, the bump may be peeled. Therefore, the thickness of the palladium layer may be 1,000 Å or less, preferably falls within the range of 200 to 300 Å. The thickness of the electroless plating layer generally falls within the range of 5 to 60 μm. The thickness of the entire bump generally falls within the range of 10 to 60 μm, too.

The above bump may have the multilayered structure, or a film of another metal may be formed as an uppermost layer, in accordance with a mounting form. More specifically, when the bump is bonded to an electrode lead using a conductive adhesive such as conductive rubber, the uppermost layer of the bump consists of nickel or a nickel-containing material such as an Ni-P alloy. On the other hand, when the bump is bonded to the electrode lead using a eutectic or solder material, or the like, a film such as a Cu, Au, Ag, or Sn film is formed as the uppermost layer of the multilayered structure by electroless plating. When the electroless-plated nickel layer is used as the underlying layer, the thickness of the plated nickel layer desirably falls within the range of submicrons to 5 μm. A solder bump may be formed on the electroless plated nickel layer serving as the underlying layer by ultrasonic soldering. A thick gold bump may be formed on the electroless-plated nickel layer serving as the underlying layer by electroless plating.

In the above-described electroless nickel plating processing, an Ni-P plating solution for precipitating an Ni-P alloy using hypophosphate as a reducing agent, a nickel-boron plating solution for precipitating an Ni-B alloy using boron hydride as the reducing agent is used as the plating solution.

In the steps of activation by the palladium and electroless plating as described above, at first, the palladium is applied to the surface of the aluminum electrode to activate aluminum, and a several-μm-thick film (bump material) is formed by electroless plating. Then, the LSI chips are dipped again in the palladium solution. After the palladium is applied to the electroless-plated film precipitated on and around the electrode surface, electroless plating is performed. Then, these operations are repeated.

According to a method of the present invention, palladium can be selectively precipitated on the electrode surface of the LSI chips. Therefore, when electroless nickel plating is executed thereafter, a nickel film can be selectively precipitated only on the aluminum electrode of the LSI chips. Therefore, highly reliable bumps in which electrical short-circuiting does not occur through of the nickel films can be formed.

According to the method of the present invention, the bump having a good adhesion to the substrate and an external wiring can be formed on the Al electrode of the LSI chip which is obtained by cutting off the wafer by the simple steps without adversely affecting the substrate and the Al electrode of the element. Therefore, a series of steps such as formation of the bumps and wireless bonding can be performed.

The bump of the present invention has a two-layered structure which consists of the palladium layer and the bump material layer precipitated by the electroless plating and which is repeatedly formed twice or more. Therefore, the bump does not have a shape such as a circular cone or pyramid in which defective connection tends to occur. In other words, each bump has a uniform height and a stable shape for the connection with the external wiring. Although the bonding strength with the external wiring, the electric characteristics, and the like of each bump are changed, depending on the height and shape, according to the bump of the present invention, highly reliable bonding with the external wiring can be achieved.

EXAMPLE 1

Figure 2A:
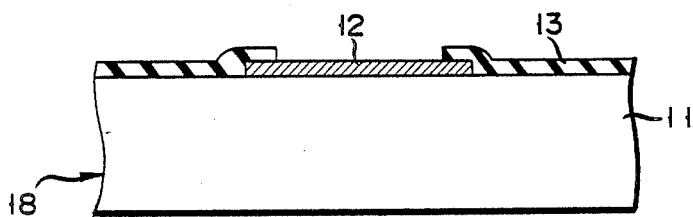

First, Al electrode 12 was formed on silicon substrate 11 on which various types of transistor, wiring, and the like (not shown) were formed according to the conventional wafer processes. Then, passivation film 13 consisting of $Si_3N_4$ was formed on the entire surface of substrate 11. Subsequently, passivation film 13 was selectively etched to prepare LSI chip 18 on which most of Al electrode 12 was exposed (FIG. 2A).

Figure 2B:
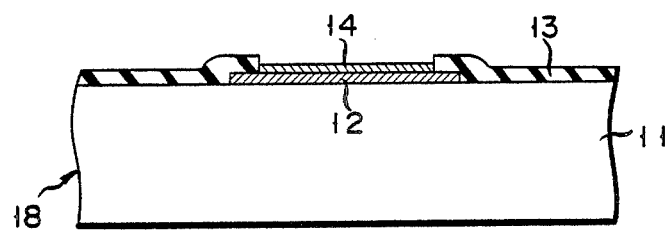

LSI chip 18 was dipped in a phosphoric acid solution and the surface of Al electrode 12 was slightly cleaned. Then, LSI chip 18 was dipped in a 9.54 l of palladium aqueous solution comprising 1 g of palladium chloride, $2 \times 10^{-4}$ g (200 ppm) of Pb, and 10 cc of hydrochloric acid at 30° C. or less for 30 sec to 1 min. Pd layer $14_1$ having a thickness of 200 Å was formed on the surface of Al electrode 12 (FIG. 2B).

Figure 2C:
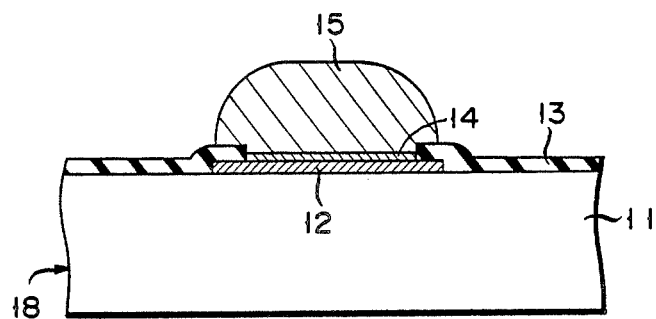

LSI chip 18 was cleaned by distilled water so that Pd layer $14_1$ was not removed. Then, LSI chip 18 was dipped in an electroless nickel plating bath containing 30 g/l of nickel chloride, 50 g/l of sodium hydroxyacetate, and 10 g/l of sodium hypophosphate, having pH of 4 to 6, and a temperature of 80° to 90° C. Electroless nickel plating was performed for about 2 hours. Then, 20-$\mu$m thick nickel film 15 containing phosphorous (to be referred to as a nickel film hereinafter) was precipitated on and around Al electrode 12 (FIG. 2C).

Figure 2D:
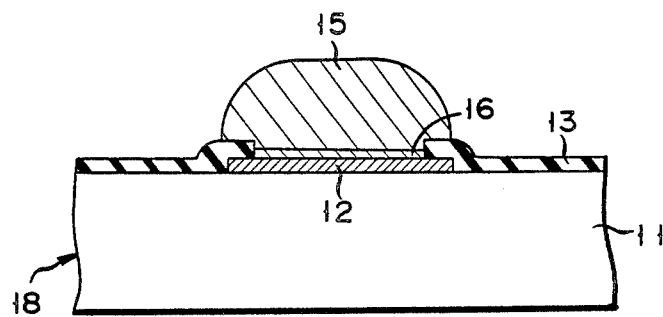

LSI chip 18 was annealed in a clean oven at 150° C. for 2 hours. Then, as shown in FIG. 2D, layer 16 containing Ni and Al was formed at the interface between Al electrode 12 and bump 15.

When the presence/absence of the short circuit between the bumps of the LSI chips according to this embodiment was checked, it is confirmed that no short circuit was present. On the contrary, when the presence/absence of a short circuit between bumps formed through the step of activation and electroless nickel plating using a palladium solution as in this example except that Pb was not contained was checked. Then, conduction and a short circuit through the nickel film precipitated on the passivation film were found between several bumps.

In this example, shear strength of the bumps before and after annealing was checked. As a result, the strength before annealing fell within the range of 30 to 60 g/bump. However, after annealing, the strength fell within the range of 130 to 170 g/bump, and it was confirmed that the adhesion of the bump on the Al electrode was remarkably improved.

EXAMPLE 2

Figure 3A:
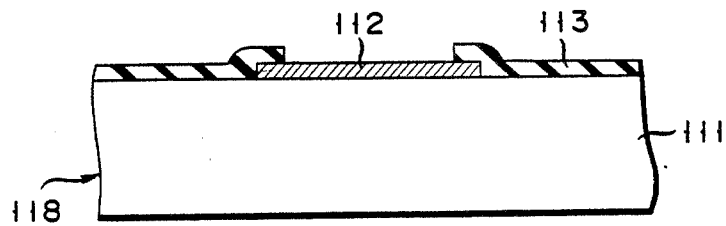

First, Al electrode 112 was formed on silicon substrate 111 on which various types of transistor, wiring, and the like (not shown) were formed according to the conventional wafer processes. Then, passivation film 113 consisting of $Si_3N_4$ was formed on the entire surface of substrate 111. Subsequently, passivation film 113 was selectively etched to prepare LSI chip 118 on which most of Al electrode 112 was exposed (FIG. 3A).

Figure 3B:
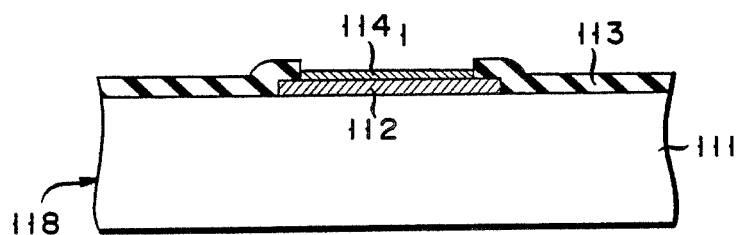

LSI chip 118 was dipped in a phosphoric acid solution and the surface of Al electrode 112 was slightly cleaned. Then, LSI chip 118 was dipped in a 9.54 l of palladium aqueous solution comprising 1 g of palladium chloride, $2 \times 10^{-4}$ g (200 ppm) of Pb, and 10 cc of hydrochloric acid at 30° C. or less for 30 sec to 1 min. Pd layer $114_1$ having a thickness of 500 Å was formed on the surface of Al electrode 112 (FIG. 3B).

Figure 3C:
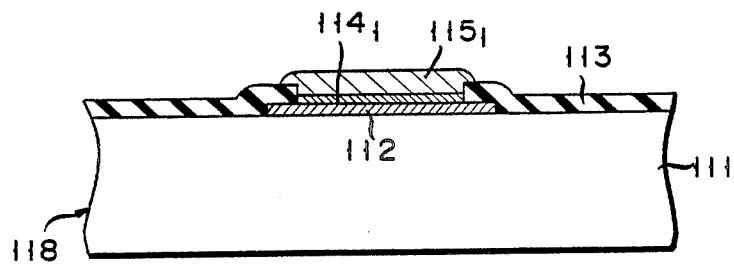

LSI chip 118 was cleaned by distilled water so that Pd layer $114_1$ was not removed. Then, LSI chip 118 was dipped into an electroless nickel plating bath containing 30 g/l of nickel chloride, 50 g/l of sodium hydroxyacetate, and 10 g/l of sodium hypophosphate, having pH of 4 to 6, and a temperature of 80° to 90° C. Electroless nickel plating was executed for about 20 minutes. Then, 5-$\mu$m thick nickel film $115_1$ containing phosphorous (to be referred to as a nickel film hereinafter) was precipitated on and around Al electrode 112 (FIG. 3C).

LSI chip 118 was cleaned by distilled water. Palladium layer $114_2$ having the same thickness as in the previous time 1 was formed again on nickel film $115_1$ by dipping in the palladium solution having the same composition as in the previous time (FIG. 3D). Then, LSI chip 118 was cleaned by distilled water to the extent that Pd layer $114_2$ was not be removed. After that, LSI chip 118 was dipped in an electroless nickel plating bath having the same composition as in the previous time and electroless nickel plating was performed for about 20 minutes to precipitate a 5-$\mu$m thick nickel film on Pd layer $114_2$ (FIG. 3E).

Assume that "one cycle" consists of dipping of the LSI chip in the palladium solution and electroless nickel plating bath. When these processes were repeated by two more cycles, as shown in FIG. 3F, palladium layer $114_3$, nickel film $115_3$, palladium layer $114_4$, and nickel film $115_4$ which have the same thicknesses as in the previous time were respectively precipitated, and bump 116 having a thickness about 20 $\mu$m was formed.

Bump 116 formed on Al electrode 112 of the LSI chip as described above has a structure in which palladium layers $114_1$ to $114_4$ and nickel films $115_1$ to $115_4$ were alternatively laminated. This bump 116 had a square pole. Note that when the portions near the interface between the nickel films constituting bump 116 were analyzed by Auger electron spectroscopy, a graph shown in FIG. 4 was obtained. As can be apparent from this graph, a Pd-containing layer was certainly present at the interface between the nickel films. Bump 116 was very strongly bonded to Al electrode 112 of LSI chip 118. In addition, when an external wiring was mounted on bump 116 of the LSI chip 118 using conductive rubber, a highly reliable junction can be realized, since bumps had the same height and a stable shape.

Note that, although the bump comprising nickel-phosphor alloy layers has been described in the above example, the uppermost layer of the bump may be electroless-plated gold or tin film. For example, an electroless-plated tin layer may be formed as the uppermost layer of the bump, a solder bump may be formed on the external wiring pattern to be mounted, and these layers may be solder-bonded by reflow.

In the above example, although dipping of the LSI chip in the palladium solution and the electroless nickel plating process are performed as "one cycle", and a total of four cycles of these processes were repeated to form the bump. However, the bump may be formed by two or three cycles, or five cycles or more.

Figure 7:
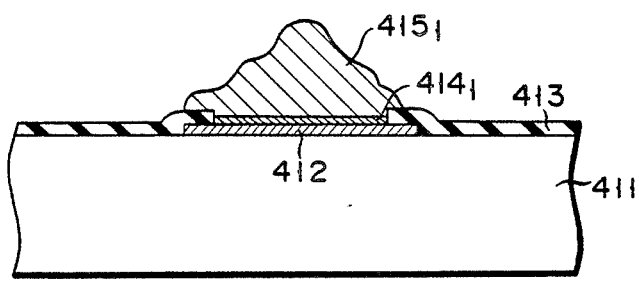
FIG. 7 is a sectional view of a bump formed in one electroless plating cycle.

As shown in FIG. 7, when Ni-plated layer $415_1$ having a thickness of 70 $\mu$m was formed on Pd layer $414_1$ by only one electroless plating cycle, the bump had a pyramid-like shape and was erroneously bonded with the external wiring. In FIG. 7, reference numeral 411 denotes a silicon substrate; 412, an Al electrode; and 413, an $Si_3N_4$ passivation film.

EXAMPLE 3

Figure 5:
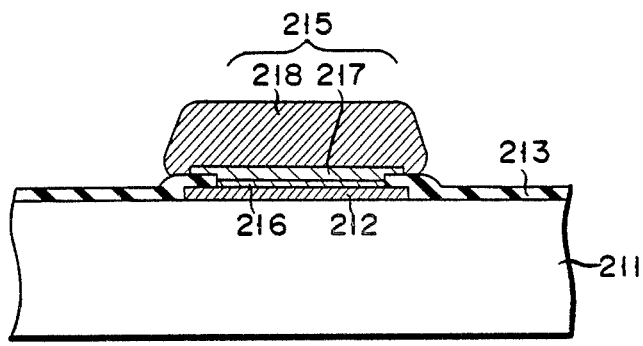
FIGS. 5 and 6 are, respectively, sectional views of bumps according to third and fourth embodiments of the present invention.

Following the same procedures as the steps shown in FIGS. 2A to 2C in Example 1, nickel film 217 having a thickness of 5 $\mu$m was precipitated on the entire surface of Al electrode 212 and passivation film 213 which were formed on silicon substrate 211. Then, the LSI chip was annealed in a clean oven at 150° C. for 2 hours to form Ni- and Al-containing layer 216 at the interface between Al electrode 212 and nickel film 217. After that, bump 215 including copper film 218 having a thickness of about 15 $\mu$m was formed by electroless copper plating (FIG. 5).

The bump formed in this example can be easily connected by a TAB because the uppermost layer of the bump was made of a copper which was softer than nickel. Note that a layer composed of gold, solder, or the like to which an external wiring is easily bonded may be formed on the copper film.

EXAMPLE 4

Figure 6:
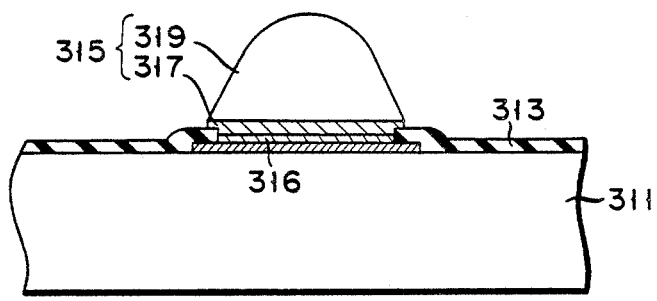

Following the same procedures as the steps shown in FIGS. 2A to 2C in Example 1, nickel film 317 having a thickness of 5 μm was precipitated on the entire surface of Al electrode 312 and passivation film 313 which were formed on silicon substrate 311. Then, the LSI chip was annealed in a clean oven at 150° C. for 2 hours to form Ni- and Al-containing layer 316 at the interface between Al electrode 312 and nickel film 317. After that, bump 315 including solder film 319 having a thickness of about 15 μm by ultrasonic soldering (FIG. 6).

The bump 315 formed in this example is mainly made of a solder. Therefore, the bump can be bonded to a TAB tape at a low temperature. As a result, the TAB tape having a laminate structure of a cover lead and a low-cost polyester film can be used in place of a polyimide film.

What is claimed is:

1. A method for forming a bump and comprising the steps of:
   dipping a semiconductor element with an Al electrode and a passivation film formed thereon in a palladium solution containing 5 to 2,000 ppm of at least one element selected from a group consisting of Zn, Pb, Sn, Cd, and Cr;
   selectively precipitating palladium on said electrode; and
   performing electroless nickel-plating on said semiconductor element, including said electrode on which palladium is precipitated.

2. A method according to claim 1, further including the step of annealing said semiconductor element at 100° to 500° C., after said step of electroless nickel-plating.

3. A method according to claim 1, further including a step of forming a copper layer on a nickel film, after said step of electroless nickel-plating.

4. A method according to claim 1, further including a step of forming a gold layer on a nickel film, after said step of electroless nickel-plating.

5. A method according to claim 1, further including a step of forming a solder layer on a nickel film, after said step of electroless nickel-plating.

6. A method according to claim 1, wherein said semiconductor element is an LSI chip.

7. A bump comprising:
   an Al electrode formed on a semiconductor element; and
   a palladium layer formed on said electrode and a bump material layer formed by electroless nickel plating which are alternatively laminated twice or more.

8. A bump according to claim 7, wherein an Au layer is formed as the uppermost layer of said bump.

9. A bump according to claim 7, wherein an Sn layer is formed as the uppermost layer of said bump.

10. A bump according to claim 7, wherein a Cu layer is formed as the uppermost layer of said bump.

11. A bump according to claim 7, wherein said semiconductor element is an LSI chip.

12. A bump according to claim 7 wherein the material constituting the bump comprises nickel.

13. A bump according to claim 12 wherein the nickel is present in a proportion greater than the other element or elements.

* * * * *